United States Patent
Bretschneider

(10) Patent No.: US 7,358,878 B2
(45) Date of Patent: Apr. 15, 2008

(54) METHOD AND ARRANGEMENT FOR MULTICHANNEL ANALOG/DIGITAL CONVERSION

(75) Inventor: Jens Bretschneider, Dresden (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/566,762

(22) PCT Filed: Jul. 16, 2004

(86) PCT No.: PCT/IB2004/051248

§ 371 (c)(1),
(2), (4) Date: Jan. 31, 2006

(87) PCT Pub. No.: WO2005/011124

PCT Pub. Date: Feb. 3, 2005

(65) Prior Publication Data

US 2006/0187102 A1 Aug. 24, 2006

(30) Foreign Application Priority Data

Jul. 31, 2003 (EP) .................................. 03102375

(51) Int. Cl.
*H03M 1/00* (2006.01)

(52) U.S. Cl. ....................... 341/141; 341/155

(58) Field of Classification Search ................ 341/141, 341/155

See application file for complete search history.

(56) References Cited

U.S. PATENT DOCUMENTS

| | | | | |
|---|---|---|---|---|
| 5,081,454 A * | 1/1992 | Campbell, Jr. et al. | ..... | 341/141 |
| 5,166,685 A * | 11/1992 | Campbell, Jr. et al. | ..... | 341/141 |
| 5,172,116 A * | 12/1992 | Noma | ......................... | 341/141 |
| 5,736,948 A * | 4/1998 | Mitsuishi et al. | ........... | 341/141 |
| 6,653,963 B1 * | 11/2003 | Barrenscheen et al. | ..... | 341/155 |
| 6,946,984 B2 * | 9/2005 | Rubin et al. | ................. | 341/141 |
| 7,242,335 B2 * | 7/2007 | Rubin et al. | ................. | 341/141 |

* cited by examiner

*Primary Examiner*—Khai M Nguyen
(74) *Attorney, Agent, or Firm*—Peter Zawilski

(57) ABSTRACT

The invention relates to a method of multichannel analog/digital (A/D) conversion, in which in a first and second channel respectively in a first or second channel provision area a first and second analog signal awaiting conversion is sampled by a respective first and second S/H (Sample & Hold) element and the respectively stored sample value thereof is applied as a channel sample to a first and second input of an analog multiplexer for selection, wherein the processing of the respective channel sample then takes place in a processing cycle of all channels by said channel sample being selected in the analog multiplexer by a digital selection control signal for the analog/digital conversion and provided as analog selection signal at an output of the analog multiplexer and after the respective channel provision area being converted in an analog/digital converter. The object according to the invention, that of providing a method in which the analog/digital conversion of a number of analog signals takes place on one chip such that costs are saved during chip production and energy is saved during use of the chip by the analog/digital conversion of the individual analog signals being adapted to the technical characteristics of their subsequent signal processing, is achieved in that an expiry of the multichannel analog/digital conversion calculated in channel controller or defined by hardware by an expiry controller is valid for the respective entire channel including the detection of the channel sample in a first or second channel provision area. The object according to the invention is also achieved by another embodiment in that an order of processing the channel sample detected in the respective first or second channel provision area, which channel sample is provided by the analog selection signal in an A/D conversion provision area and then converted by the A/D converter, is calculated and determined individually for each channel sample by a channel controller.

13 Claims, 3 Drawing Sheets

METHOD AND ARRANGEMENT FOR MULTICHANNEL ANALOG/DIGITAL CONVERSION

The invention relates to an arrangement and a method for multichannel analog/digital (A/D) conversion, in which in a first and second channel respectively in a first or second channel provision area a first and second analog signal awaiting conversion is sampled by a respective first and second S/H (Sample & Hold) element and the respectively stored sample value thereof is applied as a channel sample to a first and second input of an analog multiplexer for selection, wherein the processing of the respective channel sample then takes place in a processing cycle of all channels by said channel sample being selected in the analog multiplexer by a digital selection control signal for the analog/digital conversion and provided as analog selection signal at an output of the analog multiplexer and after the respective channel provision area being converted in an analog/digital converter.

With the increasing use of digital signal processing, there is also a great trend for making analog signals available for digital signal processing by means of analog/digital conversion.

In the prior art, it is frequently seen that in order to use digital signal processing even a number of analog signals have to be converted into digital signals.

An analog/digital converter, based on most use cases, is an expensive circuit part. In it, besides any resistor network, the reference generation forms a large part of the converter. Attempts are thus aimed at simplifying analog/digital converters and/or using them in a multiple manner. This is all the more urgent when the conversion of analog signals is provided, which as dynamic signals change very quickly and as a result one or more sample & hold elements have to be connected upstream of the necessary analog/digital converter.

Moreover, providers of integrated circuits try to minimize the IP costs and the resulting risk by using the same design or a design with minimal changes as far as possible for all necessary converter types. Each type of converter is operated differently close to its original design limits.

The prior art can thus be outlined very well using the example of the current market situation in the case of wireless networks and radio transmission systems, e.g. WLAN and Bluetooth.

This market situation is shaped by the customers' desire to make it possible for a number of radio systems to be available simultaneously on one (universal) solution.

To date only a few multi-WLAN/WAN/PAN solutions are available on the market on account of the expensive circuit technology. As the simplest solution in the circuit design strategy, the signal processing paths of all radio systems are implemented in parallel.

This requires, for example, two analog/digital converter blocks which in the known solutions are usually provided as two identical blocks for the receive path and the receive signal strength. The analog/digital converter for the latter signals may, however, be designed with a lower sampling rate. The lack of such analog/digital converter blocks that can be adapted to different conversion rates or triggered by external detection signals prevents universal interfaces from coming onto the market.

It can be seen that a circuit design strategy which provides, even in the case of different requirements in terms of the sampling rate or when observing technical limits of analog/digital converters that can be triggered externally, a multiple provision of ready-made solutions is not optimal.

With regard to the increased circuit costs, this strategy thus proves to be disadvantageous on the one hand on account of the high space requirement and the small chip surface and on the other hand on account of the high power consumption due to the circuit parts which have excessive capability.

One object is thus to provide a method in which the analog/digital conversion of a number of analog signals takes place on one chip such that costs are saved during chip production and energy is saved during use of the chip by the analog/digital conversion of the individual analog signals being adapted to the technical characteristics of their subsequent signal processing.

The solution to this object according to the invention provides that an expiry of the multichannel analog/digital conversion calculated in a channel controller or defined by hardware by an expiry controller is valid for the respective entire channel including the detection of the channel sample in a first or second channel provision area.

Another embodiment of the solution to the object according to the invention is achieved in that an order of processing the channel sample detected in the respective first or second channel provision area, which channel sample is provided by the analog selection signal in an A/D conversion provision area and then converted by the A/D converter, is calculated and determined individually for each channel sample by a channel controller.

From the solutions according to the invention that are described above it can be seen that, regardless of whether the detection of the sample takes place individually or internally in a clock-controlled manner, the resource of the A/D conversion potential is managed in a manner optimally adapted to the signals of the respective channel which arise.

A further embodiment of the solution to the object according to the invention is that the calculations created in the channel controller for the expiry of the multichannel analog/digital conversion are valid exclusively for detecting the channel samples in the first or second channel provision area, wherein the detection of the channel sample present in the first or second channel provision area is respectively triggered by a first and second external detection signal.

One variant of the solution to the object according to the invention is that a multichannel analog/digital conversion that continues the detection of the channel sample present as analog signal in the first and/or second channel provision area is initiated in the A/D conversion provision area by an external conversion request signal which thus deposits a conversion request in the channel controller.

A special variant of the solution to the object according to the invention is that additional data of the detected channel sample, which qualify an individual calculation of the time for processing a respectively detected channel sample in the channel controller, are notified to the channel controller with the triggering of the conversion request by the additional external conversion request signal.

One special refinement of the inventive solution is obtained in that the additional data, which are respectively notified to the channel controller with the detected channel sample upon triggering of the associated conversion request signal, are an initial priority date, an increase rate of the priority per unit time, and an overall and a minimum validity period.

One preferably special solution to the object according to the invention provides that the conversion request signals are fed to the channel controller together with the additional data on a data bus.

A further variant of the solution to the object according to the invention is obtained in that the rules for individually calculating the time for processing a respectively detected channel sample are derived by means of metrics implemented in the channel controller.

One embodiment of the further variant of the solution to the object according to the invention is obtained in that all signal-influencing times which lead to a shortening of the validity of a channel sample compared to its individual sampling period within the first and/or second channel from the first and/or second S/H element to the A/D S/H element upstream of the A/D converter are combined to form an invalidity period and with their invalidity period form a configuration variable that influences the metrics.

One special variant of the solution to the object according to the invention is obtained in that one configuration variable that influences the metrics is the residual validity of a channel sample.

Another special variant of the solution to the object according to the invention is shown in that one configuration variable that influences the metrics is the minimum sampling period of a channel sample.

One important refinement of the inventive solution is obtained in that the residual validity of a channel sample, which results from the currently remaining validity period of a respective channel sample present as analog signal in the respective assembly defining the analog signal, is determined in the form of a realized integrator assigned to this analog signal.

In this case, the integrator initial value which represents the validity period that has passed is presently monitored. If this value exceeds the representing value of the overall validity, expiry of the validity period is ascertained.

Otherwise its difference from the representing value of the overall validity is the representing value of the remaining validity period.

A likewise special variant of the solution to the object according to the invention is obtained in that one configuration variable that influences the metrics is the randomly predefined priority of a channel sample.

One refinement of the inventive solution is obtained in that the respectively currently remaining validity period of the output signals of all the assemblies defining the analog signals in the first and second channel provision area is known to the channel controller and the remaining validity period is continuously determined anew in advance, and in that the next signal processing step in the respective assembly defining the analog signal is thus triggered by the channel controller.

A further refinement of the inventive solution is obtained in that in the case of expiry of the validity period of one of the output signals of the assemblies defining the analog signals being determined by the channel controller in the first and second channel provision area, an error signal assigned to the respective output signal is output by the channel controller.

As an alternative, in the case of an available first S/H buffer memory or first further buffer memory or second S/H buffer memory or second further buffer memory these output signals are buffer-stored by means of a first buffer memory control signal or first further buffer memory control signal or second buffer memory control signal or second further buffer memory control signal.

One important variant of the solution to the object according to the invention is obtained in that one configuration variable that influences the metrics is the buffer-storage that has taken place of a channel sample in a first and/or second S/H intermediate element and/or a first and/or second further buffer memory.

One further fundamentally different variant of the solution to the object according to the invention is obtained in that the maximum conversion rate with which the analog selection signal is A/D-converted in the A/D conversion provision area is in a ratio $V_i$ (i—channel index) to the respective detection rate of the first and second analog signal in the first and second channel provision area, said ratio being respectively settable by the channel controller and being averaged over the period of an overall processing cycle.

By means of this respectively averaged ratio $V_1$, $V_2$ in the first and second channel a control signal regime generated by the channel controller is produced, wherein during the overall processing cycle, which is composed of successive processing part-cycles, the order and frequency of processing a respective channel sample of the first and second channel provision area is selected by this control signal regime in the processing part-cycles such that by means of the thereby set respective averaged ratio $V_1$, $V_2$ of the respective detection rate in the first and second channel to the maximum conversion rate during the period of the overall detection cycle in the A/D conversion provision area it is ensured that the time required to detect the overall number of channel samples of the first and second analog signal detected within the first and second channel provision area with the respectively set detection rates is balanced out with the time required to A/D-convert all these values provided as analog selection signal in the A/D conversion provision area.

The channel controller will determine the value of the sum of the detection rates in the first and second channel provision area and if it exceeds the value of the maximum conversion rate in the A/D conversion provision area will output an error signal.

The detection of the first and second analog signal in each case takes place by memories in the first and second S/H element, which is triggered by means of a first and second S/H control signal by the channel controller with the respective detection rate.

In order to provide the analog selection signal the analog multiplexer is actuated by the selection control signal in accordance with the control signal regime of the channel controller.

The subsequent A/D conversion of the analog selection signal is carried out by actuating the A/D converter with the A/D conversion signal, which in each case is carried out by the channel controller in accordance with the control signal regime with the desired conversion rate.

This solution is aimed at performing, according to the invention, the analog/digital conversion in the individual channels in a manner interleaved over time such that the A/D (analog/digital) converter is optimally loaded by multiple use in the first and/or second channel.

By means of the first and second S/H (sample & hold) control signal and the analog selection control signal that are in each case output by the channel controller, the duration and order for the detection of the individual sample values of the first and second channel provision area are optimally determined and fixedly predefined.

In this case, in the A/D (analog/digital) conversion provision area, the A/D conversions are carried out such that within an overall processing cycle at least one sample value of a respective channel is detected and A/D-converted, wherein the overall processing cycle consists of one or more part-detection cycles which are likewise configured by the channel controller.

If there is an overall detection cycle with more than one part-detection cycle, then within the processing of the respective part-detection cycle not necessarily at least one sample value of a respective channel has to be detected. In respectively different part-detection cycles, different combinations of the detected sample values are produced in the first and second channel provision area.

During the processing of the part-detection cycles within an overall detection cycle, therefore, no respectively fixed ratio of the conversion rate of the analog selection signal to be converted in the A/D conversion provision area to the respective detection rate of the first and second analog signal in the first and second channel provision area is yet formed.

This fixed ratio is only formed following expiry of the overall detection cycle, wherein the proportional number of the respective average ratio is deduced from the range of fractional numbers.

One variant of the solution to the object according to the invention is obtained in that the respective average ratio $V_i$ of the respective detection rate of the first and second analog signal (11, 12) in the first and second channel provision area to the maximum conversion rate of the analog selection signal in the A/D conversion provision area is characterized by the ratio:

$$V_i : \ldots : V_n \text{ (i—channel index, n—channel number)}$$

with the subsidiary condition:

$$\sum_{i=1}^{n} U_i * V_i \leq 1$$

where: i—channel index 1, 2, . . . i . . . n (i is a natural number),
n—channel number (n is a natural number),
$U_i$—channel factor (fractional number), with $U_i > 1$.

In this case, with a channel factor greater than 1 the shortening of the validity of a channel sample can be mapped in comparison to the sampling period.

Optionally, a buffer-storage of the first and second analog signal in the first and second channel provision area is carried out by means of a first and second S/H intermediate element or first and second further buffer memory.

One special variant of the solution to the object according to the invention is obtained in that the respective ratio of the respective detection rate of the first and second analog signal in the first and second channel provision area to the maximum conversion rate of the analog selection signal in the A/D conversion provision area is binary-weighted and is characterized by the ratio equation:

$$V_i : \ldots : V_n = 1/(2^i) : \ldots : 1/(2^n)$$

with the subsidiary condition:

$$\sum_{i=1}^{n} \frac{1}{2^i} \leq 1$$

where: i—channel index 1, 2, . . . i . . . n (i is a natural number), and n—channel number (n is a natural number, n>1).

For this case of the binary-weighted ratio factors $V_i$, it is usually possible to manage without buffer-storage of the first and second analog signal in the first and second channel provision area by means of a first and second S/H intermediate element. Optionally, in the event of unfavorable implementation conditions, buffer-storage may also be carried out in this variant.

A further variant of the solution to the object according to the invention provides that within the A/D conversion provision area a buffer-storage of the analog selection signal, triggered by the channel controller by means of the A/D converter control signal, is carried out in the A/D sample & hold element, wherein the A/D converter sample is provided at the output of the A/D sample & hold element for subsequent A/D conversion in the A/D converter.

One additional variant of the solution to the object according to the invention is obtained in that an output area comprising the digital demultiplexer and connected at least indirectly downstream of the A/D conversion provision area comprising the analog/digital converter at least indirectly provides at the respective outputs of the digital demultiplexer the value converted for each channel by means of the demultiplexer selection signal output by the channel controller.

These values are then buffer-stored in a first and second memory element assigned to the respective channel, said memory elements in each case likewise belonging to the output area, and read during activation of a respective first and second validity signal.

A supplementary variant of the solution to the object according to the invention is obtained in that in times in which the assemblies contained in the A/D conversion provision area and in the first and second channel provision area are not being used, these are placed in a state of low energy consumption.

In this case, the analog/digital converter is not performing any conversion. Moreover, the first and/or second S/H buffer memories and/or first and/or second further buffer memories are not storing any channel samples or analog selection signals.

As a result, the overall energy consumption is determined by the respective sampling ratios of the A/D conversion signal and/or the first and/or second S/H buffer memory control signal and/or first and/or second further buffer memory control signal.

A further variant of the solution to the object according to the invention is provided in that the multichannel analog/digital conversion takes place in the first and/or second channel and/or in a further channel, wherein the further channel is actuated by the channel controller by means of a control bus of the further channel.

A supplementary further variant of the solution to the object according to the invention is provided in that the first or second analog signal or a further analog signal is input to the first and/or second channel and/or at least one further channel for processing, wherein the channels that are multiple-occupied by an analog signal are actuated all differently or some differently by means of the associated external detection signals or S/H control signals.

The invention will be further described with reference to an example of embodiment shown in the drawings to which, however, the invention is not restricted.

Figure 1:
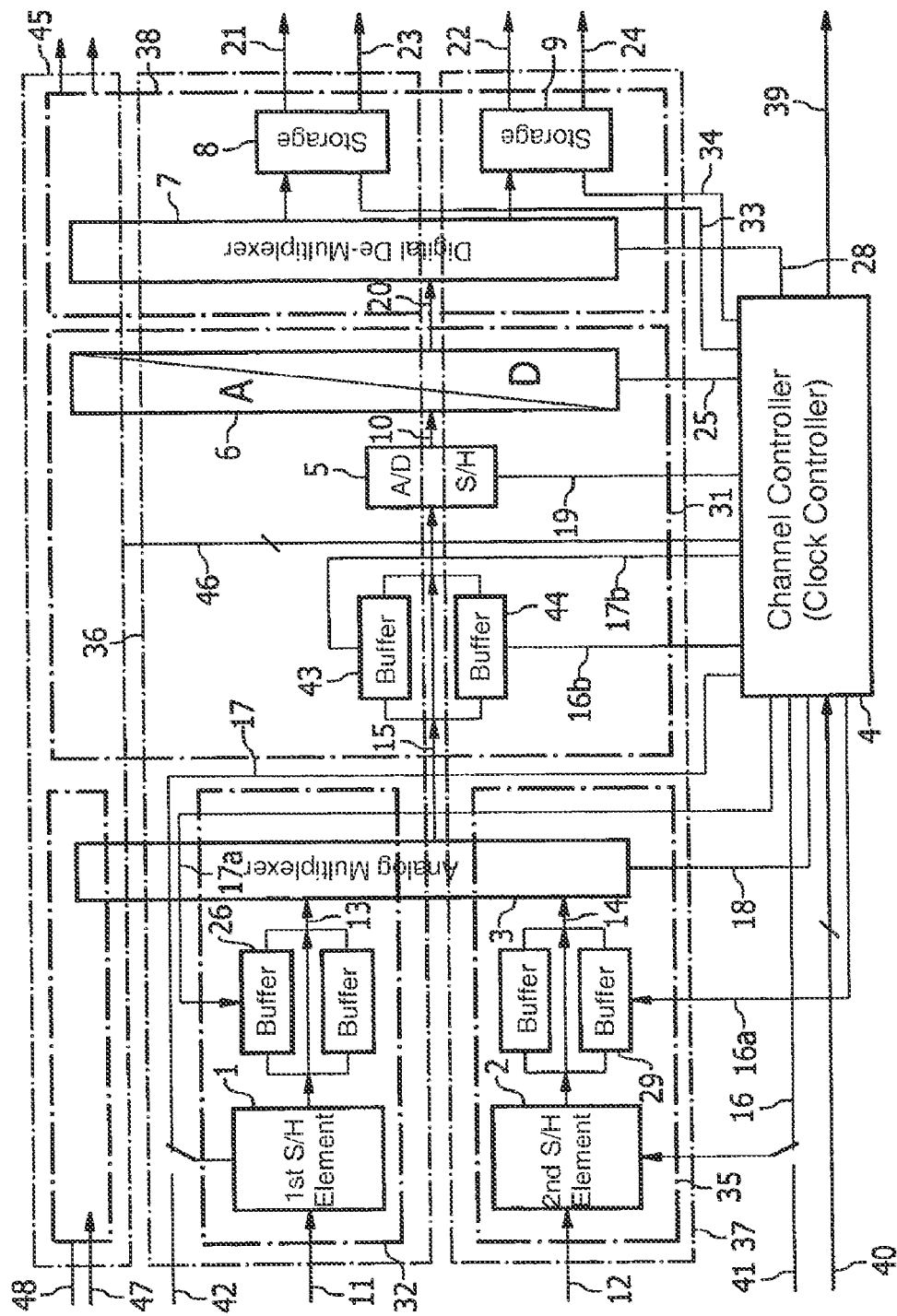
FIG. 1 shows a block diagram of the multichannel A/D conversion.

In the method of multichannel A/D conversion shown in FIG. 1, there can be seen the first and second channel 36; 37 and a further channel 45. These channels are actuated by the channel controller 4 via control lines, which control lines in the case of the further channel 45 have been combined to form a supplementary control bus of the further channel 46.

The respective first, second and further analog signal 11; 12 and 47 pass into the respective channel and thus into the respective first and second channel provision area 32; 35 and are detected there in the respective first and second S/H element 1; 2. There, the detection of the respective sample takes place optionally on the one hand by a first and/or second external detection signal 41; 42 and/or by a further external detection signal 48 or on the other hand by a first and/or second S/H control signal 17; 16, which is derived from the internal clock of the channel controller 4.

Hereinbelow, in the example of embodiment, first the clock-controlled multichannel A/D conversion will be explained, with reference also being made to FIG. 2.

The explanation is based on the example of those input signals in which the first and second analog signals 11; 12 respectively detected in the first and second S/H elements 1; 2 are detected with binary-weighted sampling rates.

Figure 2:
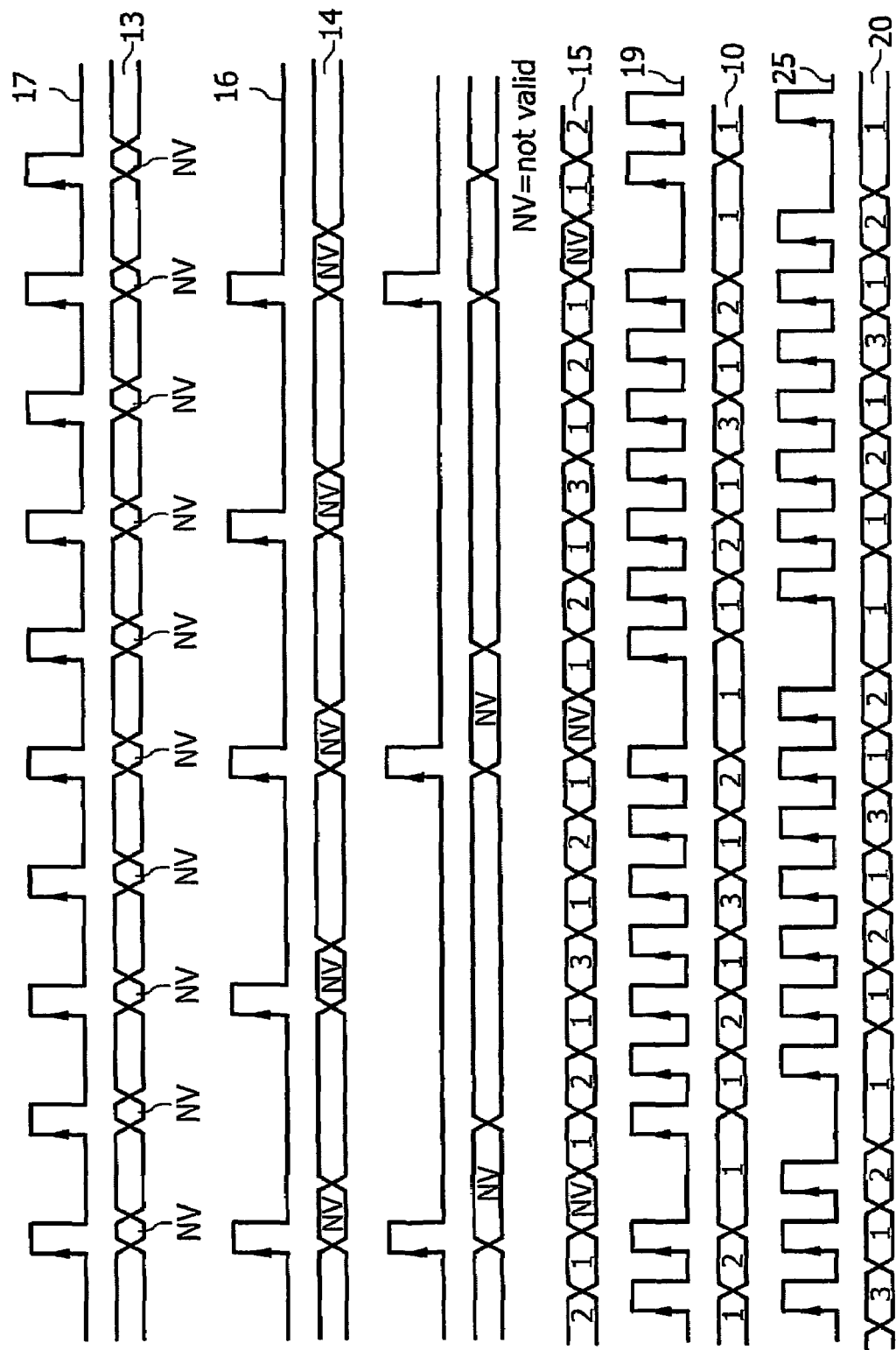
FIG. 2 shows a timing diagram of the clock-controlled multichannel A/D conversion.

As can be seen in FIG. 2, the first S/H control signal 17 at its associated first S/H element 1 triggers detection twice as often as the second S/H control signal 16. The further analog signal 47 is sampled with only a quarter of the sampling rate compared to the first S/H control signal 17. In accordance with the sampling rates of the analog signals, the associated sample values of the first and second channel sample 13; 14 are provided with the respective frequency at the output of each S/H element. They are present at the output of the respective first and second S/H element 1; 2 with a component-based delay. They are provided at the output of the multiplexer 3 as analog selection signal 15 with a further component-based delay.

It is also possible to see in FIG. 2 that the individual values of the channel samples of a channel are present in the analog selection signal 15, interlaced in their sequence with the values of the channel samples of the other channels.

In this present sequence, these detected samples are detected by means of the A/D converter S/H control signal 19 in the A/D S/H element 5 and are kept ready there for the A/D conversion in the A/D converter 6 which is triggered by the A/D conversion signal 25.

In accordance with the sequence present, the converted values are digitally applied to the output as A/D converter output signal 20. From there, these values are transmitted to the output area 38 and applied to the demultiplexer 7. The demultiplexer is actuated by the channel controller 4 via the demultiplexer selection signal 28, so that the selected digital values are stored in the respective first and second output storage element 8; 9 and output when valid during the active first and second validity signal 23; 24.

Preferably, the output area 38, or parts of the latter, is/are set apart from the rest of the circuit and formed such that a bus connected to the output of the A/D converter 6, with its demultiplexer and storage functions, indirectly takes over essential tasks of the output area 38, and directly connected demultiplexers and downstream output storage elements are thus no longer required.

In the following explanation of the example of embodiment, the individually calculated multichannel A/D conversion will be explained, with reference also being made to FIG. 3.

In this example it can be seen that the detection of the respective analog signals in respective samples is triggered by a first and/or second external detection signal 41; 42 or a further external detection signal 48. No restrictions as to the sequence of the samples or to known signal sequences are thus given.

The resource A/D conversion rate must in this case be managed. For this purpose, besides the respective conversion request triggered after a detection, use is also made of all additional data supplied therewith, which additional data are provided on the conversion request bus 40 of the channel controller 4.

The order of processing the channel sample 13; 14 detected in the respective first or second channel provision area 32; 35, said channel sample being provided by the analog selection signal 15 in an A/D conversion provision area 31 and then converted by the A/D converter 6, is calculated and determined individually for each channel sample via a channel controller 4. For this, it uses the rules for individually calculating the time for processing a respectively detected channel sample, which exist with the implemented metrics.

Compared to the above-described example of embodiment of clock-controlled multichannel A/D conversion, it can be seen that in this example of embodiment, independently of fixed ratios of the detection rate, the A/D conversion potential is managed in a manner optimally adapted to the samples of the respective channel which arise, preferably by means of the additional data which are provided via the conversion request bus 40.

Figure 3:
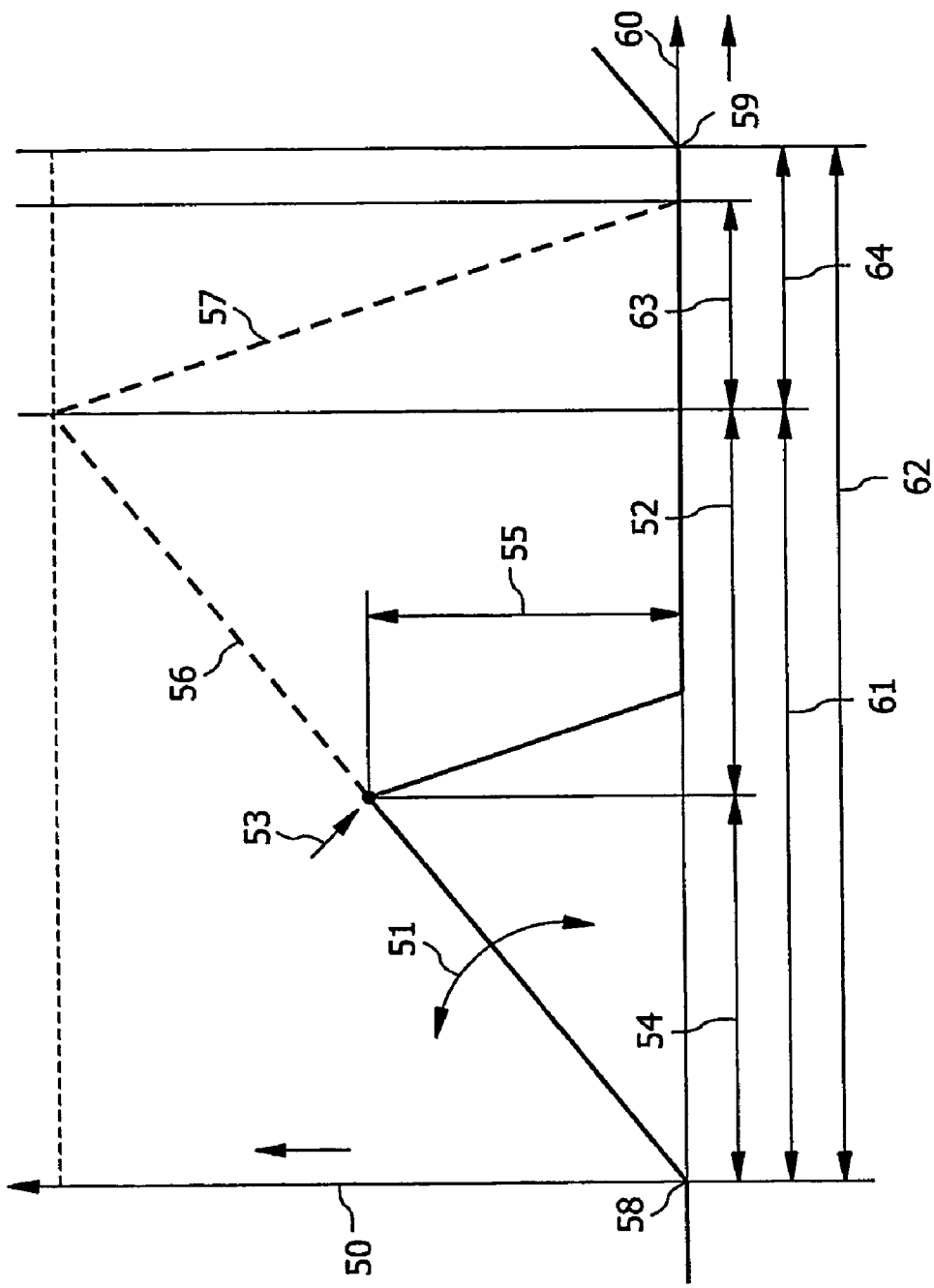
FIG. 3 shows a timing diagram of the multichannel A/D conversion calculated individually for each sample.

As can be seen in FIG. 3, besides the triggered and thus known detection time of a sample 58 and the associated additional data provided in the conversion request signal 40, an initial priority 50, an increase rate of the priority per unit time 51, an overall validity period 61 and a minimum validity period and also an invalidity period 64 are known.

The minimum sampling period 62 of the analog signal is known as a technical characteristic of the latter.

Accordingly, the selected A/D conversion start 53 is determined by the channel controller 4 by means of the charge ramp 56 that represents the current priority within the residual validity time 52.

LIST OF REFERENCES 1 first S/H (sample & hold) element
2 second S/H (sample & hold) element
3 analog multiplexer
4 channel controller (clock controller)
5 A/D sample & hold element
6 A/D converter
7 digital demultiplexer
8 first output storage element
9 second output storage element
10 A/D converter sample (sample value)
11 first analog signal
12 second analog signal
13 first channel sample (sample value)
14 second channel sample (sample value)
15 analog selection signal
16 second S/H control signal
16a second buffer memory control signal
16b second further buffer memory control signal
17 first S/H control signal
17a first buffer memory control signal
17b first further buffer memory control signal
18 selection control signal 19 A/D converter S/H control signal
20 A/D converter output signal
21 first channel output value
22 second channel output value
23 first validity signal
24 second validity signal
25 A/D conversion signal
26 first S/H buffer memory
29 second S/H buffer memory
28 demultiplexer selection signal
31 A/D conversion provision area
32 first channel provision area
33 first channel storage signal
34 second channel storage signal
35 second channel provision area
36 first channel
37 second channel
38 first output area
39 second output area
40 conversion request bus
41 second external detection signal
42 first external detection signal
43 first further buffer memory
44 second further buffer memory
45 further channel
46 control bus of the further channel
47 further analog signal
48 further external detection signal
50 initial priority
51 increase rate of the priority
52 residual validity (remaining possible A/D conversion start)
53 selected A/D conversion start
54 expired possible A/D conversion start
55 present relative priority of a signal
56 charge ramp representing the priority
57 discharge ramp representing the priority that is to be reset
58 detection time of a sample
59 next detection time of a sample
60 A/D converter variation over time
61 overall validity (maximum possible A/D conversion start)
62 minimum sampling period
63 maximum discharge time
64 invalidity period

The invention claimed is:

1. A method of multichannel analog/digital (A/D) conversion, in which in a first and second channel respectively in a first or second channel provision area a first and second analog signal awaiting conversion is sampled by a respective first and second S/H (Sample & Hold) element and the respectively stored sample value thereof is applied as a channel sample to a first and second input of an analog multiplexer for selection, wherein the processing of the respective channel sample then takes place in a processing cycle of all channels by said channel sample being selected in the analog multiplexer by a digital selection control signal for the analog/digital conversion and provided as analog selection signal at an output of the analog multiplexer and, after the respective channel provision area, being converted in an analog/digital converter, wherein an order of processing the channel sample detected in the respective first or second channel provision area, which channel sample is provided by the analog selection signal in an A/D conversion provision area and then converted by the A/D converter, is calculated and determined individually for each channel sample by a channel controller, wherein calculations created in the channel controller for an expiry of the multichannel analog/digital conversion are valid exclusively for detecting the channel samples in the first or second channel provision area, wherein the detection of the channel sample present in the first or second channel provision area is respectively triggered by a first and second external detection signal.

2. A method as claimed in claim 1, wherein a multichannel analog/digital conversion that continues through the detection of the channel sample present as analog signal in the first and/or second channel provision area is initiated in the A/D conversion provision area by an external conversion request signal which thus deposits a conversion request in the channel controller.

3. A method as claimed in claim 2, wherein additional data of the detected channel sample, which qualify an individual calculation of the time for processing a respectively detected channel sample in the channel controller, are notified to the channel controller with the triggering of the conversion request by the additional external conversion request signal.

4. A method as claimed in claim 3, wherein the additional data, which are respectively notified to the channel controller with the detected channel sample upon triggering of the associated conversion request signal, are an initial priority date, an increase rate of the priority per unit time, and an overall and a minimum validity period.

5. A method as claimed in claim 4, wherein the conversion request signals are fed to the channel controller together with the additional data on a data bus.

6. A method as claimed in claim 1, wherein all signal-influencing times which lead to a shortening of the validity of a channel sample compared to its individual sampling period within the first and/or second channel from the first and/or second S/H element to the A/D S/H element upstream of the A/D converter are combined to form an invalidity period and with their invalidity period form a configuration variable that influences the metrics.

7. A method as claimed in claim 1, wherein one configuration variable that influences the metrics is the residual validity of a channel sample.

8. A method as claimed in claim 1, wherein one configuration variable that influences the metrics is the minimum sampling period of a channel sample.

9. A method as claimed in claim 1, wherein the residual validity of a channel sample, which results from the currently remaining validity period of a respective channel sample present as analog signal in the respective assembly defining the analog signal, is determined in the form of a realized integrator assigned to this analog signal, wherein the integrator initial value which represents the validity period that has passed is presently monitored and, if this value exceeds the representing value of the overall validity, expiry of the validity period is ascertained, and otherwise its difference from the representing value of the overall validity is the representing value of the remaining validity period.

10. A method as claimed in claim 1, wherein one configuration variable that influences the metrics is the randomly predefined priority of a channel sample.

11. A method as claimed in claim 1, wherein the respectively currently remaining validity period of the output signals of all the assemblies defining the analog signals in the first and second channel provision area is known to the channel controller and the remaining validity period is continuously determined anew in advance, and in that the next signal processing step in the respective assembly defining the analog signal is thus triggered by the channel controller.

12. A method as claimed in claim 1, wherein in the case of expiry of the validity period of one of the output signals of the assemblies defining the analog signals being determined by the channel controller in the first and second channel provision area, an error signal assigned to the respective output signal is output by the channel controller, or in the case of an available first S/H buffer memory or first further buffer memory or second S/H buffer memory or second further buffer memory these output signals are buffer-stored by means of a first buffer memory control signal or first further buffer memory control signal or second buffer memory control signal or second further buffer memory control signal.

13. A method as claimed in claim 1, wherein one configuration variable that influences the metrics is the buffer-storage that has taken place of a channel sample in a first and/or second S/H intermediate element and/or a first and/or second further buffer memory.

* * * * *